(12) United States Patent
Noguchi et al.

(10) Patent No.: US 6,177,690 B1
(45) Date of Patent: Jan. 23, 2001

(54) SEMICONDUCTOR LIGHT EMITTING DEVICE HAVING A P-N OR P-I-N JUNCTION

(75) Inventors: Hiroyasu Noguchi; Eisaku Kato; Akira Ishibashi, all of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/190,436

(22) Filed: Nov. 13, 1998

(30) Foreign Application Priority Data

Nov. 14, 1997 (JP) .................................................. 9-314108

(51) Int. Cl.⁷ .................................................. H01L 33/00
(52) U.S. Cl. .................. 257/96; 257/13; 257/14; 257/101; 257/103
(58) Field of Search .................. 257/14, 12, 13, 257/94, 96, 103, 101, 614; 372/45, 46

(56) References Cited

U.S. PATENT DOCUMENTS 4,829,357 * 5/1989 Kasahara .................................. 257/94

\* cited by examiner

Primary Examiner—Minh Loan Tran
(74) Attorney, Agent, or Firm—Sonnenschein, Nath & Rosenthal

(57) ABSTRACT

A semiconductor light emitting device having good characteristics, high reliability and long lifetime includes a p-n junction or p-i-n junction made by locating an active layer in a position inside an n-type doped layer or p-type doped layer sufficiently distant from the depletion layer between the p-type doped layer and the n-type doped layer. When a component of intensity of light from the active layer normal to the active layer is $P(x)$, x for its maximum value $P_{max}$ is $x=0$, and the range of x satisfying $P(x) > P_{max}/e^2$ is $-L_n < x < L_p$ in a semiconductor light emitting device having a p-n junction, doping concentration of at least a portion of the n-type doped layer where $x > -L_n$ is made lower than doping concentration of the other portion of the n-type doped layer, or doping concentration of at least a part of the p-type doped layer where $x < L_p$ is made lower than doping concentration of the other part of the p-type doped layer.

23 Claims, 12 Drawing Sheets

SEMICONDUCTOR LIGHT EMITTING DEVICE HAVING A P-N OR P-I-N JUNCTION

BACKGROUND OF THE INVENTION

1. Field of the Invention

This invention relates to a semiconductor light emitting device especially suitable for use as a semiconductor light emitting device using II–VI compound semiconductors.

2. Description of the Related Art

Recently, semiconductor lasers used for record/reproduce of high-density optical discs or magneto-optical discs to emit blue to green light, and light emitting diodes used in large-scale displays or signal lamps to emit blue to green light, are under active researches and developments.

The most hopeful materials for manufacturing these semiconductor light emitting devices for emission of blue to green light are II–VI compound semiconductors combining a group II element such as zinc (Zn), cadmium (Cd), magnesium (Mg), mercury (Hg) or beryllium (Be) and a group VI element such as sulfur (S), selenium (Se), tellurium (Te), or oxygen (O). Semiconductor light emitting devices using these II–VI compound semiconductors are currently under improvements of device characteristics and the lifetime.

Multiplication of dislocations derived from stacking defects in the active layer was pointed out as an important factor of shortening the lifetime of a semiconductor light emitting device using II–VI compound semiconductors. In order to decrease such stacking defects, various approaches were made, such as growing a GaAs buffer layer on a GaAs substrate prior to growth of II–VI compound semiconductors, or optimizing the initial sequence of growing II–VI compound semiconductors. As a result, the lifetime of semiconductor light emitting devices using II–VI compound semiconductors was elongated to over 100 hours at the room temperature. Thereafter, along with the decrease in stacking defects, point defects in active layers have been pointed out as a factor of deterioration of devices. In order to prevent multiplication of point defects, although it is important to establish a growth condition which decreases point defects themselves, it is also necessary to stabilize the electronic state of point defects and to decrease their mobility so as to prevent their coupling.

Moreover, in semiconductor light emitting devices including a ZnCdSe active layer, it has been confirmed that a certain emission wavelength shifts to a shorter wavelength probably because of diffusion of Cd upon a supply of an electric power and that the p-type carrier concentration decreases by annealing. Therefore, device characteristics might be changed by diffusion of component atoms of a crystal or impurities. However, it is not easy to artificially control these diffusion phenomena.

On the other hand, it has been reported that, in devices using a ZnCdSe quantum well layer doped with nitrogen as a p-type impurity, annealing invites serious diffusion of Cd. It is explained as resulting from an unstable electronic state of vacancies of group II atoms (hereinafter called "group II vacancies") existing in the crystal and from an increase in mobility. That is, since group II vacancies intrinsically stabilize by getting free electrons as acceptors, when electrons become less in the crystal as a result of p-type doping, the electronic state of group II vacancies becomes unstable and liable to move. Since group II atoms, Cd, diffuses via movements of vacancies, Cd also becomes liable to move along with the increase in mobility of the group II vacancies.

In this manner, diffusion of component atoms of the active layer is closely related to the doping method employed, it is desirable to optimize it so as to minimize deterioration of the active layer.

Semiconductor light emitting devices having a separate confinement heterostructure (SCH) are characterized in effective confinement of light because of the structure where light cannot easily exude from the active layer into the cladding layer having a lower refractive index. However, since it is impossible to completely confine light, there is the possibility that light exuding into the cladding layer excites the energy state of originally unstable atoms or defects and they diffuse toward the active layer. Especially, chlorine (Cl) and nitrogen (N), which are impurities of II–VI compound semiconductors have smaller lattice constants as compared with component atoms such as Zn and Se, are considered to be weak in coupling force between atoms, and are apt to get into unstable energy states. Actually, in a semiconductor laser using II–VI compound semiconductors, it was confirmed that the carrier concentration of a p-type cladding layer decreases under a supply of electric power, and it causes an increase in threshold current value. A possible reason thereof may be that N atoms in the p-type cladding layer are excited by light, get off from lattice sites of group VI atoms, and inactivated or that Cl atoms in the n-type cladding layer are exited similarly, propagate and reach the p-type cladding layer, and compensate acceptors.

In an experiment made by the Inventors, when a semiconductor light emitting device was electrically powered, Cl atoms in the n-type cladding layer diffused and moved the position of the p-n junction. More specifically, a semiconductor light emitting device as shown in FIG. 1 was prepared, and the position of the p-n junction was measured before and after electric power supply to the semiconductor light emitting device by an electron beam induced current (EBIC) method. As a result, before being electrically powered, the p-n junction entirely appeared in the active layer as shown in FIG. 2, but after being electrically powered, a part of the p-n junction in the stripe region moved toward the p-side as shown in FIG. 3. In FIGS. 2 and 3, the EBIC signal is shown by the hatched region. Presumably, such a movement in position of the p-n junction decreases the injection efficiency of carriers into the active layer, increases the threshold current value, and decreases the lifetime of the device.

Under the situation, it has been difficult heretofore to realize a semiconductor light emitting device with good characteristics, high reliability and long lifetime.

OBJECTS AND SUMMARY OF THE INVENTION

It is therefore an object of the invention to provide a semiconductor light device having good characteristics, high reliability and a long lifetime by artificially controlling the electronic state of point defects or component atoms near an active layer by doping, thereby stabilizing the electronic state and preventing diffusion of the point defects or component atoms, hence preventing deterioration of the active layer, and preventing the phenomenon that dark points caused by aggregation or multiplication of point defects, for example, decrease the emission efficiency and invite an increase in threshold current value.

Another object of the invention is to provide a semiconductor light device having good characteristics, high reliability and a long lifetime by diminishing the doping amount sufficiently in a region near the active layer so that an optical field excites the electronic state of impurity atoms having a weak inter-atom coupling force and prevents diffusion thereof.

Through earnest researches for overcoming the problems involved in the conventional technologies, the Inventors have found that a main reason of deterioration of the active layer in a conventional semiconductor light emitting device by the above-explained mechanism lies in that the active layer is located in the depletion layer between the p-type doped layer and the n-type doped layer and is depleted itself, and has got the conclusion that, in order to remove the above-explained problems, it is effective to locate the active layer inside an n-type doped layer or p-type doped layer in a location apart from the depletion layer. Conditions necessary for this purpose are explained below.

FIG. 4 schematically shows an energy band diagram of p-i-n junction made by a p-type doped layer, undoped layer and n-type doped layer. Let here the doping concentration of the p-type doped layer be $N_a$, doping concentration of the n-type doped layer be $N_d$, thickness of the undoped layer be l, dielectric constant of the p-type doped layer, undoped layer and n-type doped layer be $\epsilon$, dielectric constant of vacuum be $\epsilon_0$, and electric charge of an electron be e. As shown in FIG. 4, let the co-ordinate axis x be extended in the direction from the n-type doped layer toward the p-type doped layer, and let the boundary between the undoped layer and the n-type doped layer be x=0. Let the thickness of the depletion layer be $L_{n0}$ in the n-type doped layer and $L_{p0}$ in the p-type layer. A built-in potential $V_{Bi}$ caused by doping levels is produced between the n-type doped layer and the p-type doped layer. Under a balanced state, field intensity distribution appears as shown in FIG. 5, and potentials in regions (I), (II) and (III) are calculated as follows.

When E is the electric field, the following equations are established from the Poisson equation.

Region (I) $dE/dx = eN_d/\epsilon_0\epsilon$ (1)

Region (II) $dE/dx = 0$ (2)

Region (III) $dE/dx = -eN_a/\epsilon_0\epsilon$ (3)

When Equations (1), (2) and (3) are integrated, and a condition of $E(-L_{n0})=0$ and the continuity of E are used, then Region (I) $E=(eN_d/\epsilon_0\epsilon)(x+L_{n0})$ (4)

Region (II) $E=eN_dL_{n0}/\epsilon_0\epsilon$ (5)

Region (III) $E=(e/\epsilon_0\epsilon)\{N_dL_{n0}-N_a(x-1)\}$ (6)

When the potential is $\phi$, $d\phi/dx=-E$. Therefore, when Equations (4), (5) and (6) are integrated, and a condition of $\phi(-L_{n0})=0$ and the continuity of $\phi$ are used, then Region (I) $\phi x)=(-eN_d/2\epsilon_0\epsilon)(x+L_{n0})^2$ (7)

Region (II) $\phi(x)=(-eN_d/\epsilon_0\epsilon)(L_{n0}x+L_{n0}^2/2)$ (8)

Region (III) $\phi(x)=(-e/\epsilon_0\epsilon)(N_dL_{n0}x-N_a(x-1)^2/2+N_dL_{n0}^2/2)$ (9)

Since $\phi(1+L_{p0})=-V_{Bi}$, from Equation (9), $N_dL_{n0}(1+L_{p0})-N_aL_{p0}^2/2+N_dL_{n0}^2/2=V_{Bi}(\epsilon_0\epsilon/e)$ (10)

is established. Here, when $N_dL_{n0}=N_aL_{p0}$ is used, $N_dL_{n0}(1+N_dL_{n0}/N_a)-N_a(N_dL_{n0}/N_a)^2/2+N_dL_{n0}^2/2=V_{Bi}(\epsilon_0\epsilon/e)$ (11)

Equation (11) can be rearranged to $(eN_d/2\epsilon_0\epsilon)\{(N_d/N_a+1)L_{n0}^2+2lL_{n0}\}-V_{Bi}=0$ (12)

When $L_{n0}$ in Equation (12) is replaced by x, $(eN_d/2\epsilon_0\epsilon)\{(N_d/N_a+1)x^2+2lx\}-V_{Bi}=0$ (13)

Therefore, by solving Equation (13) for x, taking a positive value L0 of the solutions, and locating the active layer in the n-type doped layer so that the active layer be distant from the boundary between the undoped layer and the n-type doped layer by a distance L satisfying L≧L0, the active layer can be located remote from the depletion layer.

Although the above explanation applies to the case where the active layer is provided in the n-type doped layer, the same applies also to a construction where the active layer is provided in the p-type doped layer. In this case, Equations (12) and (13) should read as $(eN_a/2\epsilon_0\epsilon)\{(N_a/N_d+1)L_{p0}^2+2lL_{p0}\}-V_{Bi}=0$ (14)

$(eN_a/2\epsilon_0\epsilon)\{(N_a/N_d+1)x^2+2lx\}-V_{Bi}=0$ (15)

Therefore, by solving Equation (15) for x, taking a positive value L0 of the solutions, and locating the active layer in the p-type doped layer so that the active layer be distant from the boundary between the undoped layer and the p-type doped layer by a distance L satisfying L≧L0, the active layer can be located remote from the depletion layer.

Especially when $N_a=N_d$, from Equations (13) and (15), $x=\{-l+(l^2+4\epsilon_0\epsilon V_{Bi}/eN_d)^{1/2}\}/2$ For example, if $V_{Bi}=2.6$eV, $N_a=1\times10^{17}$cm$^{-3}$, $N_d=1\times10^{17}$cm$^{-3}$, l=100 nm, $\epsilon=9.3$, then x=76 nm.

In case of a semiconductor light emitting device having a p-n junction, it may be considered that l=0. So is it also when a semiconductor light emitting device has a SCH structure as shown in FIG. 6.

In order to prevent deterioration of the active layer or movements of the location of the p-n junction due to an influence of light emitted from the active layer, it is important to separate impurities, which might diffuse when excited by light, from the optical field as far as possible. Next explained are conditions required for it.

FIG. 7 shows an energy band diagram and distribution of the optical field around the active layer of a semiconductor light emitting device having a SCH structure. The coordinate axis x extends from the n-type cladding layer toward the p-type cladding layer. Let here the x-direction component of the intensity of light emitted from the active layer be P(x), and let P(x) be maximized to $P_{max}$ when x=0. P(x) can be calculated from the band structure near the active layer and physical property constants of respective layers. When the penetration length $L_n$ of light released from the active layer into the n-type cladding layer and the penetration length $L_p$ of same into the p-type cladding layer are defined by a distance rendering P(x) be $1/e^2$ of the maximum value $P_{max}$ (where e is the base of natural logarithm). Then, x satisfying $P(x)>P_{max}/e^2$ is in the range of $-L_n<x<L_p$. Assuming that the band structure is symmetric about the active layer, and making calculation of a typical semiconductor light emitting device using AlGaInP III–V compound semiconductors, relations of $L_n$ and $L_p$ relative to the thickness of the optical guide layer can be obtained as shown in FIG. 8. It is known from FIG. 8 that, when the total thickness of the optical guide layer is 200 nm, for example, $L_n = L_p = 300$ nm, and light exudes into the cladding layer by nearly 300 nm.

Therefore, in order to minimize influences of light released from the active layer and to prevent deterioration of the active layer, it is effective to make the doping concentration $N_{ds}$ in at least a part of the n-type cladding layer where $x > -L_n$ be lower than the doping concentration $N_d$ in the other portion and to make the doping concentration $N_{as}$ in at least a part of the p-type cladding layer where $x < L_p$ be lower than the doping concentration $N_a$ in the other portion. It is still effective to establish only one of them.

The present invention has been made through the above-explained researches made by the Inventor.

According to the first aspect of the invention, there is provided a semiconductor light emitting device having a p-n junction made of a p-type doped layer and an n-type doped layer, or a p-i-n junction made of a p-type doped layer, an undoped layer and an n-type doped layer, comprising:

an active layer located in a position inside the n-type doped layer or the p-type doped layer distant from a depletion layer produced between the p-type doped layer and the n-type doped layer.

According to the second aspect of the invention, there is provided a semiconductor light emitting device having a p-n junction made of a p-type doped layer and an n-type doped layer, or a p-i-n junction made of a p-type doped layer, an undoped layer and an n-type doped layer, comprising:

an active layer located in a position inside the n-type doped layer distant from the boundary between the p-type doped layer or the undoped layer and the n-type doped layer by a distance L satisfying $L \geq L0$ relative to a positive value $L0$ obtained by solving x from the equation $$(eN_d/2\epsilon_0\epsilon)\{(N_d/N_a+1)x^2+2lx\} - V_{Bi} = 0$$

where $N_a$ is the doping concentration of the p-type doped layer, $N_d$ is the doping concentration of the n-type doped layer, l is the thickness of the undoped layer (regarded as $l=0$ in case of the p-n junction), $V_{Bi}$ is the built-in potential produced between the p-type doped layer and the n-type doped layer, $\epsilon$ is the specific dielectric constant of the p-type doped layer, n-type doped layer and undoped layer, $\epsilon_0$ is the dielectric constant of vacuum, and e is the electric charge of an electron.

According to the third aspect of the invention, there is provided a semiconductor light emitting device having a p-n junction made of a p-type doped layer and an n-type doped layer, or a p-i-n junction made of a p-type doped layer, an undoped layer and an n-type doped layer, comprising:

an active layer located in a position inside the p-type doped layer distant from the boundary between the p-type doped layer or the undoped layer and the n-type doped layer by a distance L satisfying $L \geq L0$ relative to a positive value $L0$ obtained by solving x from the equation $$(eN_a/2\epsilon_0\epsilon)\{(N_a/N_d+1)x^2+2lx\} - V_{Bi} = 0$$

where $N_a$ is the doping concentration of the p-type doped layer, $N_d$ is the doping concentration of the n-type doped layer, l is the thickness of the undoped layer (regarded as $l=0$ in case of the p-n junction), $V_{Bi}$ is the built-in potential produced between the p-type doped layer and the n-type doped layer, $\epsilon$ is the specific dielectric constant of the p-type doped layer, n-type doped layer and undoped layer, $\epsilon_0$ is the dielectric constant of vacuum, and e is the electric charge of an electron.

In the second and third aspects of the invention, from the viewpoint of separating the active layer from the depletion layer without degrading the carrier injection efficiency, preferably $L \leq 150$ nm, more preferably $L \leq 100$ nm, and more preferably $L \leq 50$ nm.

In the second and third aspects of the invention, taking it into account that a large amount doping will invite point defects and will possibly cause non-radiative recombination, from the viewpoint of stabilizing the energy level of the active layer without degrading the emission efficiency, the doping concentration is preferably from $3 \times 10^{16} \text{cm}^{-3}$ to $3 \times 10^{17} \text{cm}^{-3}$, and more preferably from $3 \times 10^{16} \text{cm}^{-3}$ to $1 \times 10^{17} \text{cm}^{-3}$.

According to the fourth aspect of the invention, there is provided a semiconductor light emitting device having a p-n junction made of a p-type doped layer and an n-type doped layer, characterized in that:

doping concentration $N_{ds}$ of at least a part of the n-type doped layer where $x > -L_n$ is lower than doping concentration $N_d$ of the other part of the n-type doped layer, when the component of the intensity of light emitted from the active layer along a coordinate axis x extending from the n-type doped layer toward the p-type doped layer, x for the maximum value $P_{max}$ of $P(x)$ is $x=0$, and x for $P(x) > P_{max}/e^2$ (where e is the base of natural logarithm) is in the range of $-L_n < x < L_p$.

According to the fifth aspect of the invention, there is provided a semiconductor light emitting device having a p-n junction made of a p-type doped layer and an n-type doped layer, characterized in that:

doping concentration $N_{as}$ of at least a part of the p-type doped layer where $x < L_p$ is lower than doping concentration $N_a$ of the other part of the p-type doped layer, when the component of the intensity of light emitted from the active layer along a coordinate axis x extending from the n-type doped layer toward the p-type doped layer, x for the maximum value $P_{max}$ of $P(x)$ is $x=0$, and x for $P(x) > P_{max}/e^2$ (where e is the base of natural logarithm) is in the range of $-L_n < x < L_p$.

In the fourth aspect of the invention, also the doping concentration $N_{as}$ of the p-type doped layer at least in the portion where $x < L_p$ is preferably lower than the doping concentration $N_a$ in the other portion of the p-type doped layer. Similarly, in the fifth aspect of the invention, also the doping concentration $N_{ds}$ at least in a part of the n-type doped layer where $x > -L_n$ is lower than the doping concentration $N_d$ in the other part of the n-type doped layer.

In the fourth and fifth aspect of the invention, from the viewpoint of sufficiently diminishing impurities excited by the optical field and preventing the adverse affection that degradation in carrier injection efficiency increases the threshold current value, without degrading the conductivity of the cladding layer, the doping concentration $N_{ds}$ of the n-type doped layer or the doping concentration $N_{as}$ of the p-type doped layer is preferably from $3 \times 10^{16} \text{cm}^{-3}$ to $3 \times 10^{17} \text{cm}^{-3}$, and more preferably from $3 \times 10^{16} \text{cm}^{-3}$ to $1 \times 10^{17} \text{cm}^{-3}$.

In the fourth and fifth aspects of the invention, from the viewpoint of preventing degradation of the carrier injection efficiency, the thickness $L_{ns}$ of the part of the n-type doped layer having the doping concentration $N_{ds}$ or the thickness $L_{ps}$ of the part of the p-type doped layer having the doping concentration $N_{as}$ is preferably not higher than 500 nm.

According to the sixth aspect of the invention, there is provided a semiconductor light emitting device having a p-n junction made of a p-type doped layer and an n-type doped layer, characterized in that the position of the p-n junction does not move when the semiconductor light emitting device is electrically powered.

In the region within 100 μm from edges of the semiconductor light emitting device, as far as the moving distance of the p-n junction by electric conduction does not exceed 300 nm, the position of the p-n junction may be regarded not to move substantially.

In the present invention, the p-type doped layer, n-type doped layer, undoped layer and active layer are typically made of II–VI compound semiconductors including one or more of group II elements selected from the group consisting of Zn, Cd, Mg, Hg and Be and one or more of group VI elements selected from the group consisting of S, Se, Te and O. In this case, the n-type impurity doped into the n-type doped layer is typically Cl whereas the p-type impurity doped into the p-type doped layer is N.

According to the first aspect of the invention having the above-mentioned structure, since the active layer can be located remote from the depletion layer produced between the p-type doped layer and the n-type doped layer in the semiconductor light emitting device having a p-n or p-i-n junction, the active layer is prevented from getting depleted, and the Fermi level ($E_f$) near the active layer can be always maintained immediately under the conduction band or immediately under the valence band. As a result, in case of a semiconductor light emitting device using II–VI compound semiconductors, for example, the electronic state of a number of point defects such as group II vacancies behaving as acceptors or point defects behaving as donors, which are present near the active layer, can be stabilized and prevented from deterioration processes such as diffusion or multiplication. Especially when the active layer is made of ZnCdSe, diffusion of Cd via group II vacancies can be prevented, and it is therefore prevented that the threshold current value increases under electric conduction due to a change of the oscillation frequency toward a shorter wavelength. It is also prevented that point defects flow into the active layer and multiply there along with diffusion of Cd.

According to the second aspect of the invention having the above-mentioned structure, since the active layer can be located remote from the depletion layer produced between the p-type doped layer and the n-type doped layer toward the n-type doped layer in the semiconductor light emitting device having a p-n or p-i-n junction, the active layer is prevented from getting depleted, and the Fermi level ($E_f$) near the active layer can be always maintained immediately under the conduction band. As a result, in case of a semiconductor light emitting device using II–VI compound semiconductors, for example, the electronic state of a number of point defects such as group II vacancies behaving as acceptors, which are present near the active layer, can be stabilized and prevented from deterioration processes such as diffusion or multiplication. Especially when the active layer is made of ZnCdSe, diffusion of Cd via group II vacancies can be prevented, and it is therefore prevented that the threshold current value increases under electric conduction due to a change of the oscillation frequency toward a shorter wavelength. It is also prevented that point defects flow into the active layer and multiply there along with diffusion of Cd.

According to the third aspect of the invention having the above-mentioned structure, since the active layer can be located remote from the depletion layer produced between the p-type doped layer and the n-type doped layer toward the p-type doped layer in contrast to the second aspect of the invention, the active layer is prevented from getting depleted, and the Fermi level near the active layer can be always maintained immediately under the valence band. As a result, the electronic state of point defects behaving as donors can be stabilized and prevented from diffusion and multiplication.

According to the fourth aspect of the invention having the above-mentioned structure, in the semiconductor light emitting device having a p-n junction, since the doping concentration $N_{ds}$ of the n-type doping layer in a region where the intensity of light released from the active layer is $P(x)>P_{max}/e^2$ is lower than that of the other region, n-type impurities excited by the optical field and diffusing toward the active layer can be decreased. As a result, factors of deterioration, such as arousing multiplication of point defects or compensating p-type carriers in the p-type doped layer, can be prevented.

According to the fifth aspect of the invention having the above-mentioned structure, in the semiconductor light emitting device having a p-n junction, since the doping concentration $N_{as}$ of the p-type doping layer in a region where the intensity of light released from the active layer is $P(x)>P_{max}/e^2$ is lower than that of the other region, p-type impurities excited by the optical field and diffusing toward the active layer can be decreased similarly to the fourth aspect of the invention. As a result, here again, factors of deterioration, such as arousing multiplication of point defects or compensating n-type carriers in the n-type doped layer, can be prevented.

According to the sixth aspect of the invention having the above-mentioned structure, in the semiconductor light emitting device having a p-n junction, since the p-n junction is prevented from moving upon a supply of electric power, a decrease in carrier injection efficiency to the active layer or a decrease in lifetime of the device due to an increase of the threshold current value can be prevented.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
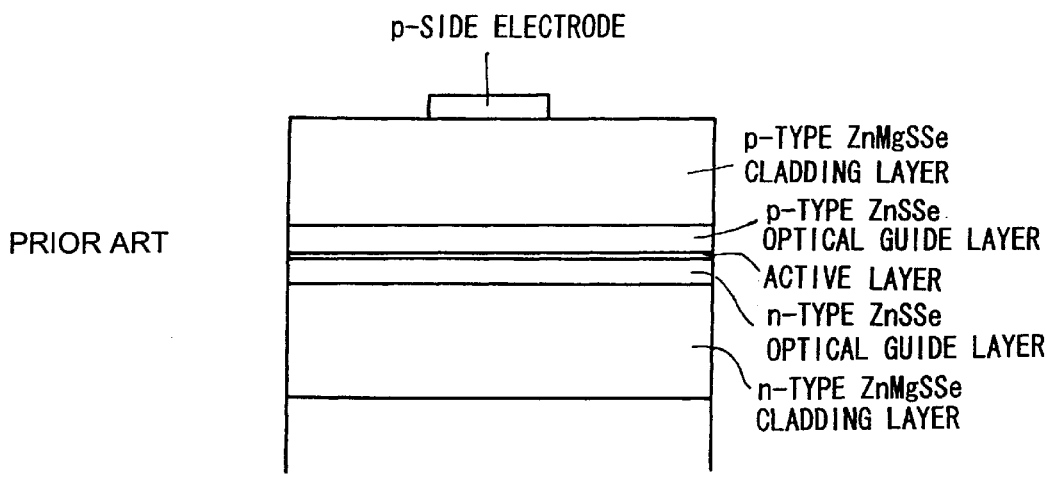
FIG. 1 is a cross-sectional view for explaining problems involved in a conventional semiconductor laser.
Figure 2:
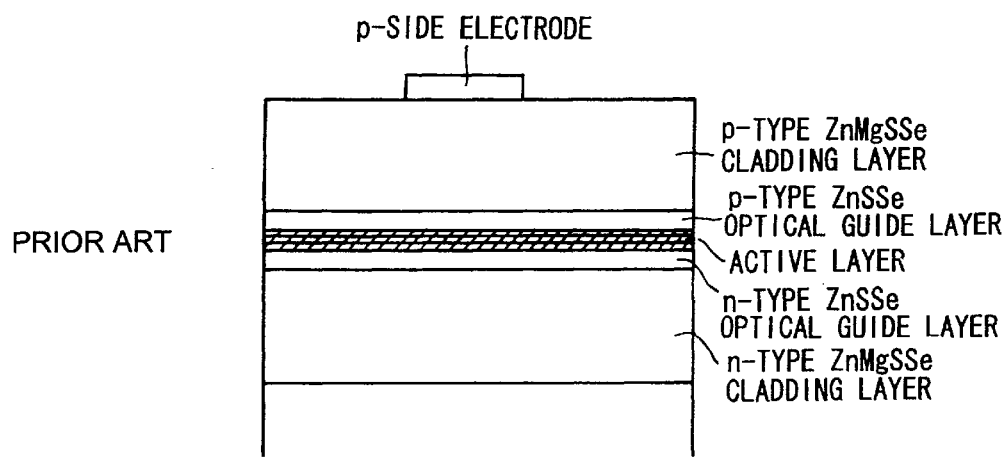
FIG. 2 is a cross-sectional view for explaining problems involved in a conventional semiconductor laser.
Figure 3:
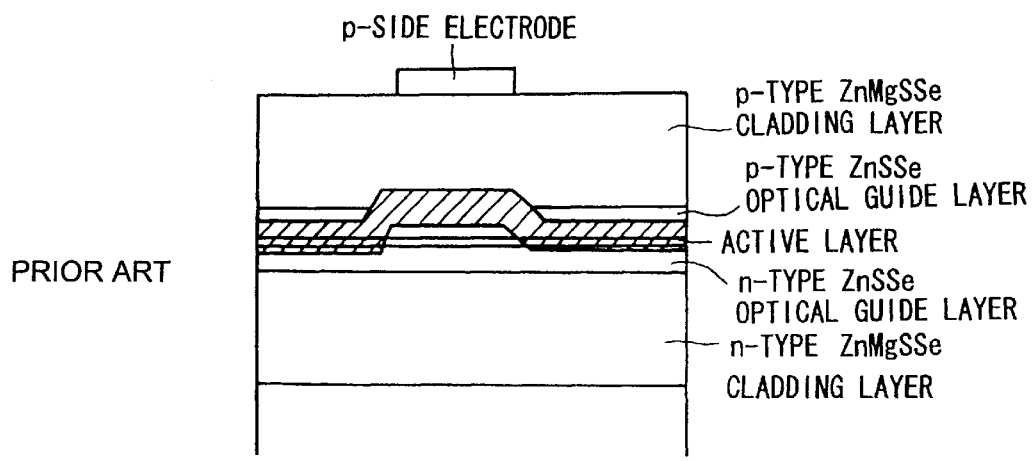
FIG. 3 is a cross-sectional view for explaining problems involved in a conventional semiconductor laser.
Figure 4:
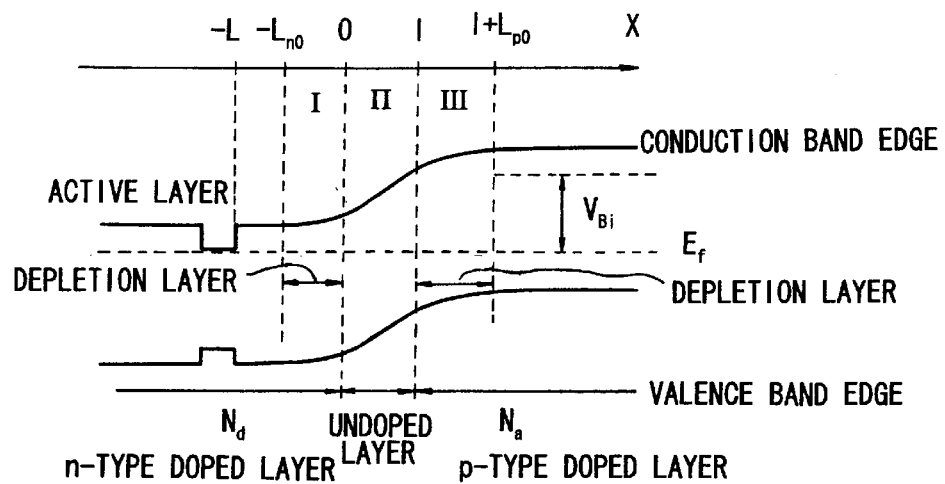
FIG. 4 is an energy band diagram for explaining the principle of the present invention.
Figure 5:
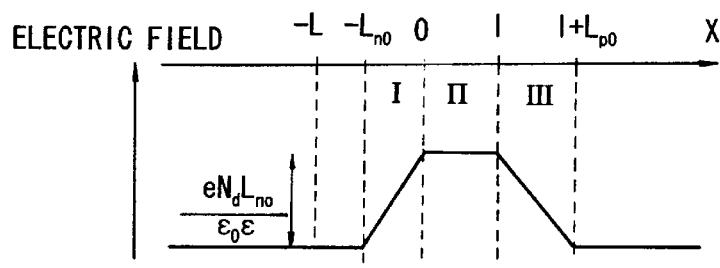
FIG. 5 is a schematic diagram for explaining the principle of the present invention.
Figure 6:
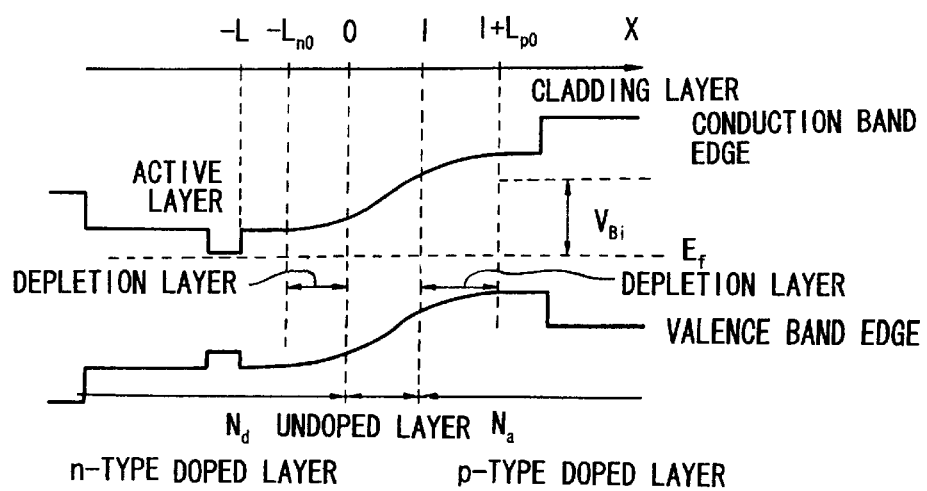
FIG. 6 is an energy band diagram for explaining the principle of the present invention.
Figure 7:
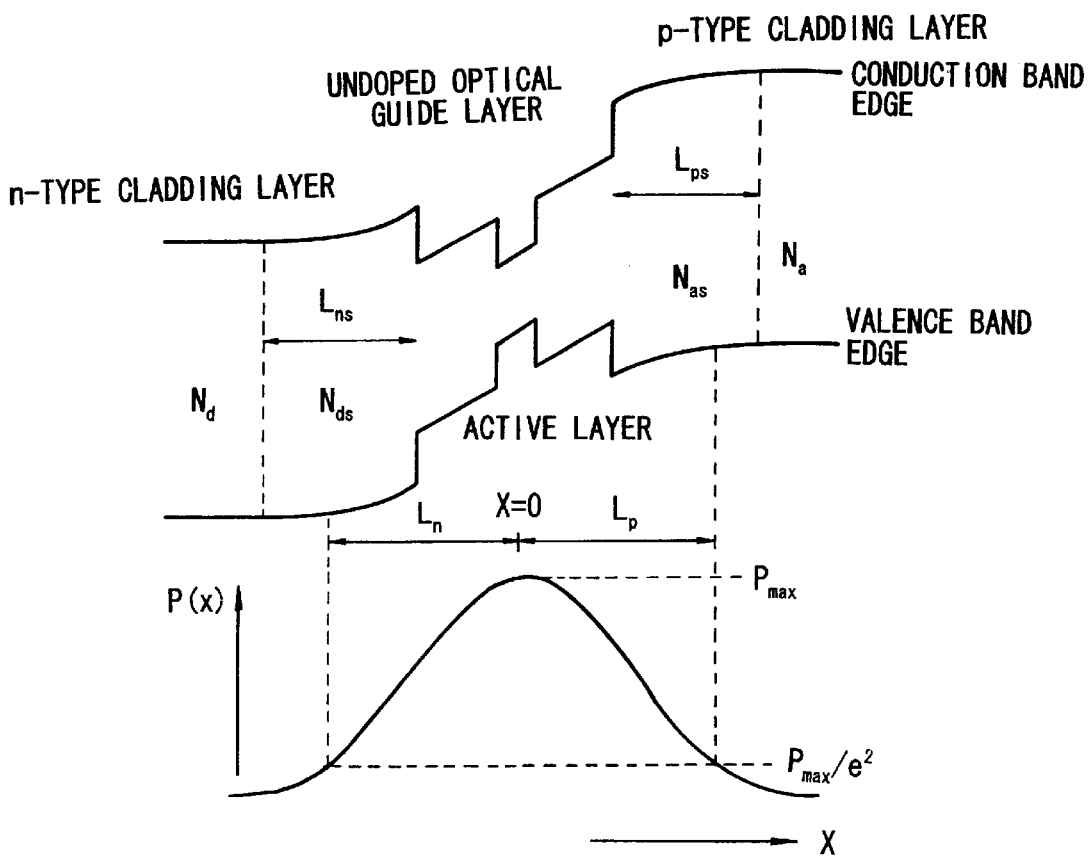
FIG. 7 is an energy band diagram for explaining the principle of the present invention.
Figure 8:
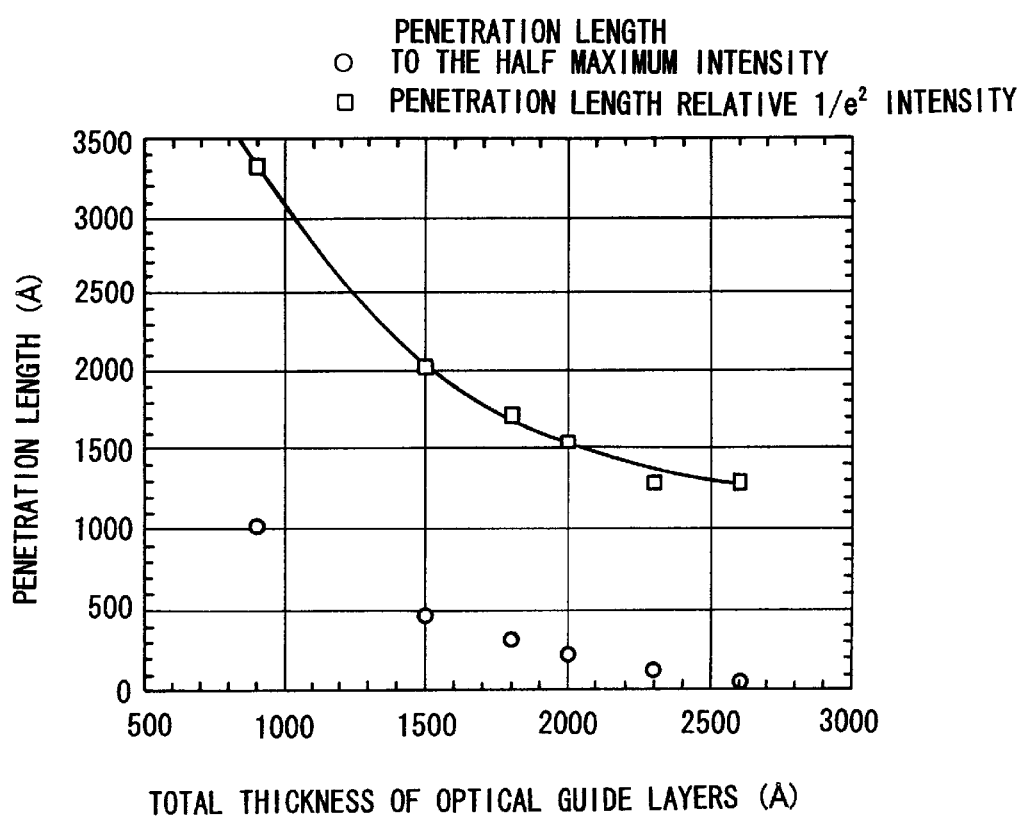
FIG. 8 is a schematic diagram showing relation between the total thickness of optical guide layers and penetration length.

Explained below are embodiments of the invention with reference to the drawings. In all of the drawings illustrating embodiments, common or corresponding parts or elements are labeled with common reference numerals.

Figure 9:
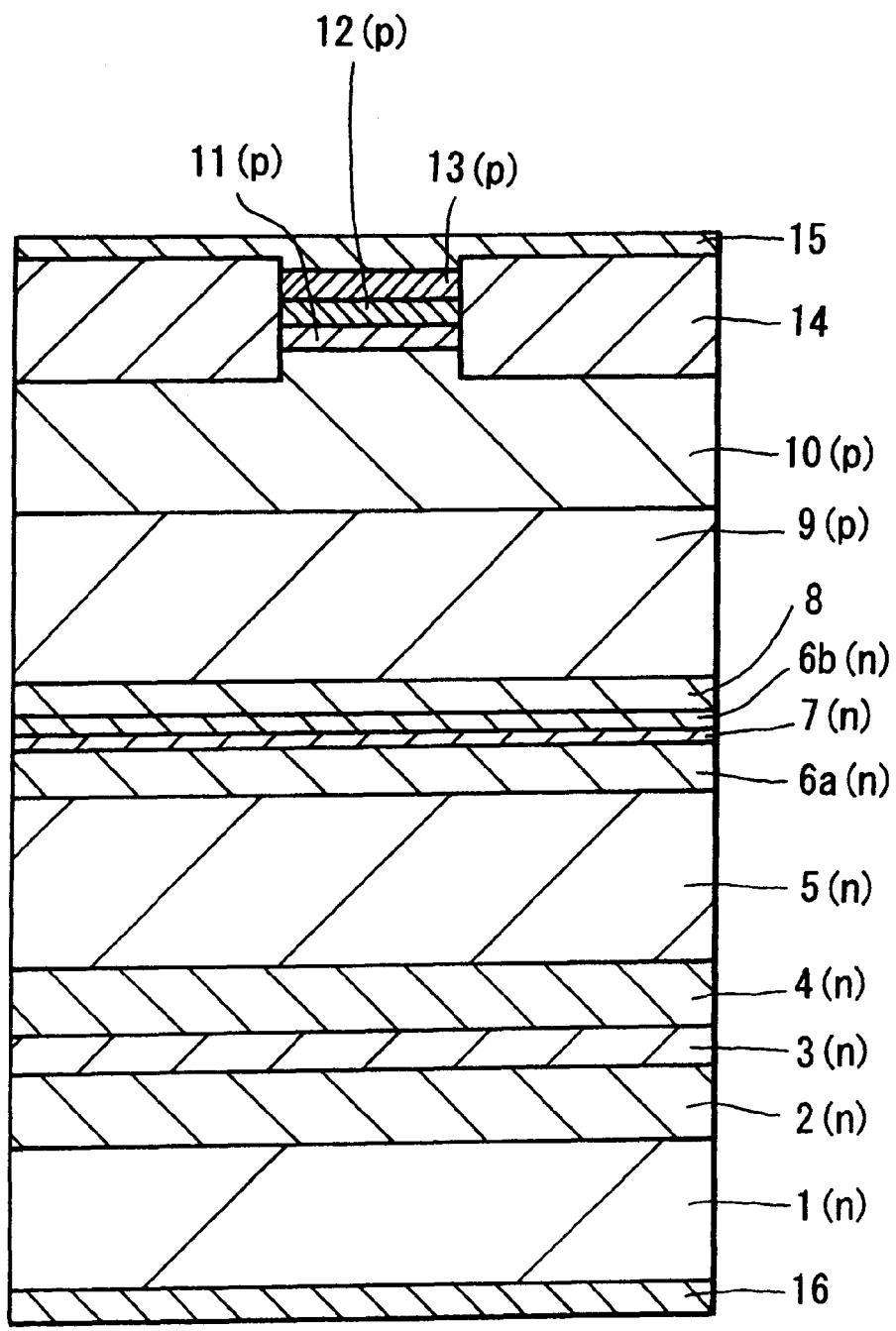
FIG. 9 is a cross-sectional view showing a semiconductor laser according to the first embodiment of the invention.

FIG. 9 shows a semiconductor laser according to the first embodiment of the invention. The semiconductor laser shown here has a SCH structure.

As shown in FIG. 9, the semiconductor laser according to the first embodiment includes a (001)-oriented n-type GaAs substrate 1 doped with, for example, silicon (Si) as an n-type impurity, on which sequentially stacked are an n-type GaAs buffer layer 2, n-type ZnSe buffer layer 3, n-type ZnSSe buffer layer 4, n-type ZnMgSSe cladding layer 5, n-type ZnSSe optical guide layer 6a, active layer 7 of a single quantum well (SQW) structure or a multiquantum well (MQW) structure including, for example, n-type ZnCdSe layers as quantum well layers, n-type ZnSSe optical guide layer 6b, undoped ZnSSe optical guide layer 8, p-type ZnMgSSe cladding layer 9, p-type ZnSSe cap layer 10, p-type ZnSe contact layer 11, p-type ZnSe/ZnTe MQW layer 12 and p-type ZnTe contact layer.

The n-type GaAs buffer layer 2 is 0.5 μm thick and doped with Si, for example, as its n-type impurity. The n-type ZnSe buffer layer 3 is 30 nm thick, for example, and doped with Cl, for example, as its n-type impurity by $1\times10^{18}cm^{-3}$, for example. The n-type ZnSSe buffer layer 4 is 50 nm thick, for example, and doped with Cl, for example, as its n-type impurity by $1\times10^{18}cm^{-3}$, for example. The n-type ZnMgSSe cladding layer 5 is 0.8 μm thick and doped with Cl, for example, as its n-type impurity by $1\times10^{17}cm^{-3}$, for example. The n-type ZnSSe optical guide layer 6a is 100 nm thick, for example, and doped with Cl, for example, as the n-type impurity by $1\times10^{17}cm^{-3}$, for example. The active layer 7 is doped with Cl, for example, as the n-type impurity by $1\times10^{17}cm^{-3}$, for example. The n-type ZnSSe optical guide layer 6b is 33 nm thick, for example, and doped with Cl, for example, by $1\times10^{17}cm^{-3}$, for example. The undoped ZnSSe optical guide layer 8 is 6 nm thick, for example. The p-type ZnMgSSe cladding layer 9 is 1 μm thick, for example, and doped with N, for example, as the p-type impurity by $1\times10^{17}cm^{-3}$, for example. The p-type ZnSSe cap layer 10 is 400 nm thick, for example, and doped with N, for example, as the p-type impurity by $5\times10^{17}cm^{-3}$, for example. The p-type ZnSe contact layer 11 is 200 nm thick, for example, and doped with N, for example, as the p-type impurity by $5\times10^{17}cm^{-3}$, for example. The p-type ZnSe layers and the p-type ZnTe layers forming the p-type ZnSe/ZnTe MQW layer 12 are doped with N, for example, as the p-type impurity. The p-type ZnTe contact layer 13 is 100 nm thick, for example, and doped with N, for example, as the p-type impurity by $3\times10^{19}cm^{-3}$, for example.

The upper-lying portion of the p-type ZnSSe cap layer 10, p-type ZnSe contact layer 11, p-type ZnSe/ZnTe MQW layer 12 and p-type ZnTe contact layer 13 has the form of a stripe extending in one direction (for example, in the <1–10> direction).

An insulation film 14 made of $Al_2O_3$, for example, is formed on the p-type ZnSSe cap layer 10 except for the stripe portion to make a current blocking structure. Alternatively, the insulation layer 14 may be made of polyimide, for example.

A p-side electrode 15 of a Pd/Pt/Au structure, for example, is made on the insulation film 14 and the p-type ZnTe contact layer 13 in ohmic contact with the p-type ZnTe contact layer 13. On the other hand, an n-side electrode 16, such as In electrode, is made on the bottom surface of the n-type GaAs substrate 1 in contact with the n-side electrode 16.

Figure 10:
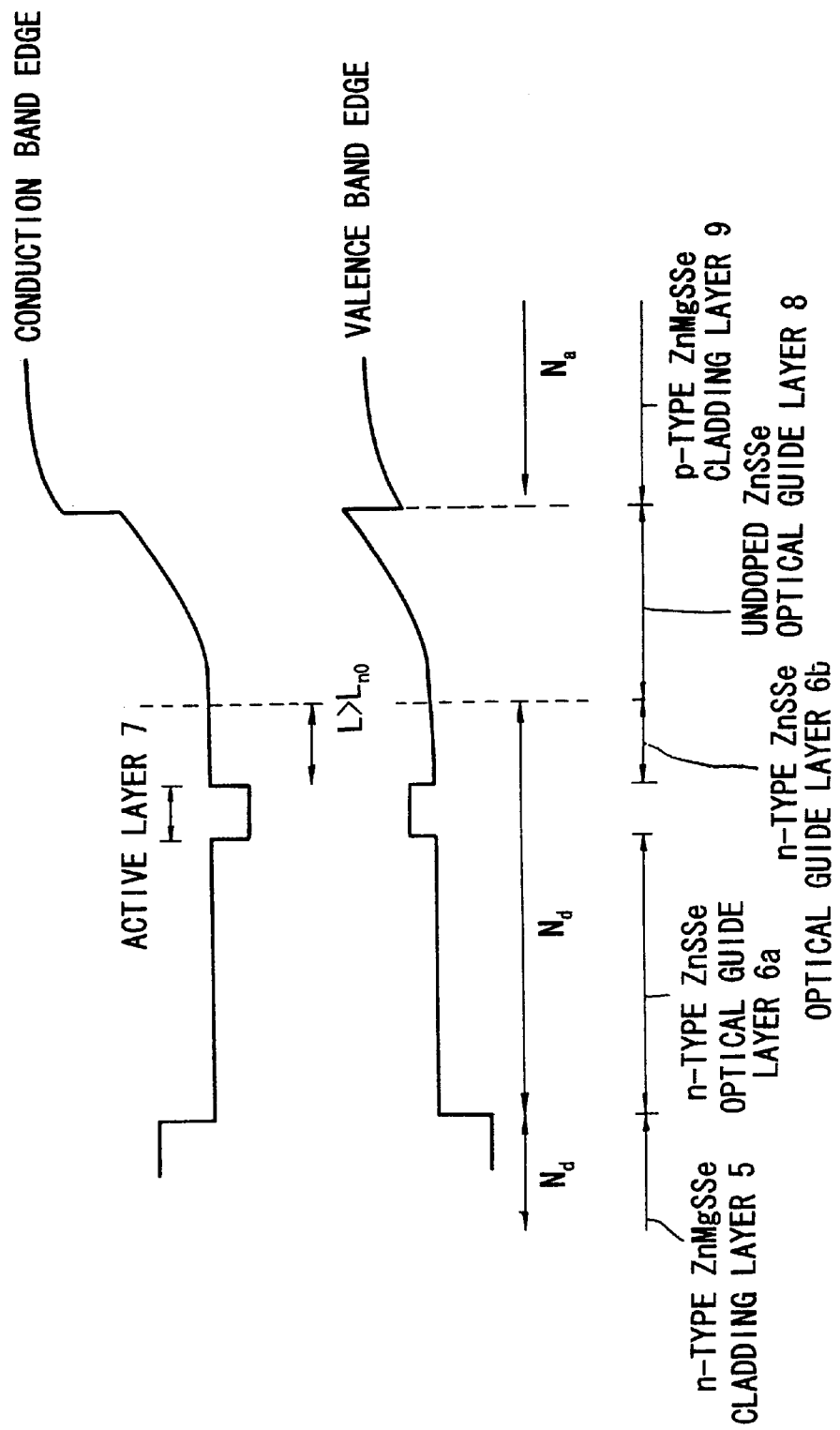
FIG. 10 is an energy band diagram of the semiconductor laser according to the first embodiment of the invention.

FIG. 10 shows an energy band diagram around the active layer 7 of the semiconductor laser according to the first embodiment. As shown in FIG. 10, the active layer 7 is sandwiched between the n-type ZnSSe optical guide layer 6a and the n-type ZnSSe optical guide layer 6b. That is, it is located inside the n-type doped layer. Moreover, since the n-type doped layer, p-type doped layer and undoped layer have the above-indicated thicknesses and doping concentrations, the active layer is distant from the boundary between the n-type ZnSSe optical guide layer 6b and the undoped ZnSSe optical guide layer 8 by a distance $L \geq L_{n0}$.

Next explained is a process for manufacturing the semiconductor laser according to the first embodiment having the above-explained structure.

The process for manufacturing the semiconductor laser starts with setting the n-type GaAs substrate 1 on a substrate holder in a vacuum chamber evacuated into an ultra-high vacuum of a MBE apparatus (not shown) for growing III–V compound semiconductors.

The n-type GaAs substrate 1 is then heated to a growth temperature, 560° C. for example, and the n-type GaAs buffer layer 2 is grown on the n-type GaAs substrate 1 by MBE. In this case, a molecular beam source of Si (Knudsen cell) is used for doping the n-type impurity, Si. Prior to growth of the n-type GaAs buffer layer 2, a surface cleaning step may be inserted to remove a surface oxide film, or the like, by heating the n-type GaAs substrate 1 to approximately 580° C., for example, for thermal etching of the surface.

Figure 11:
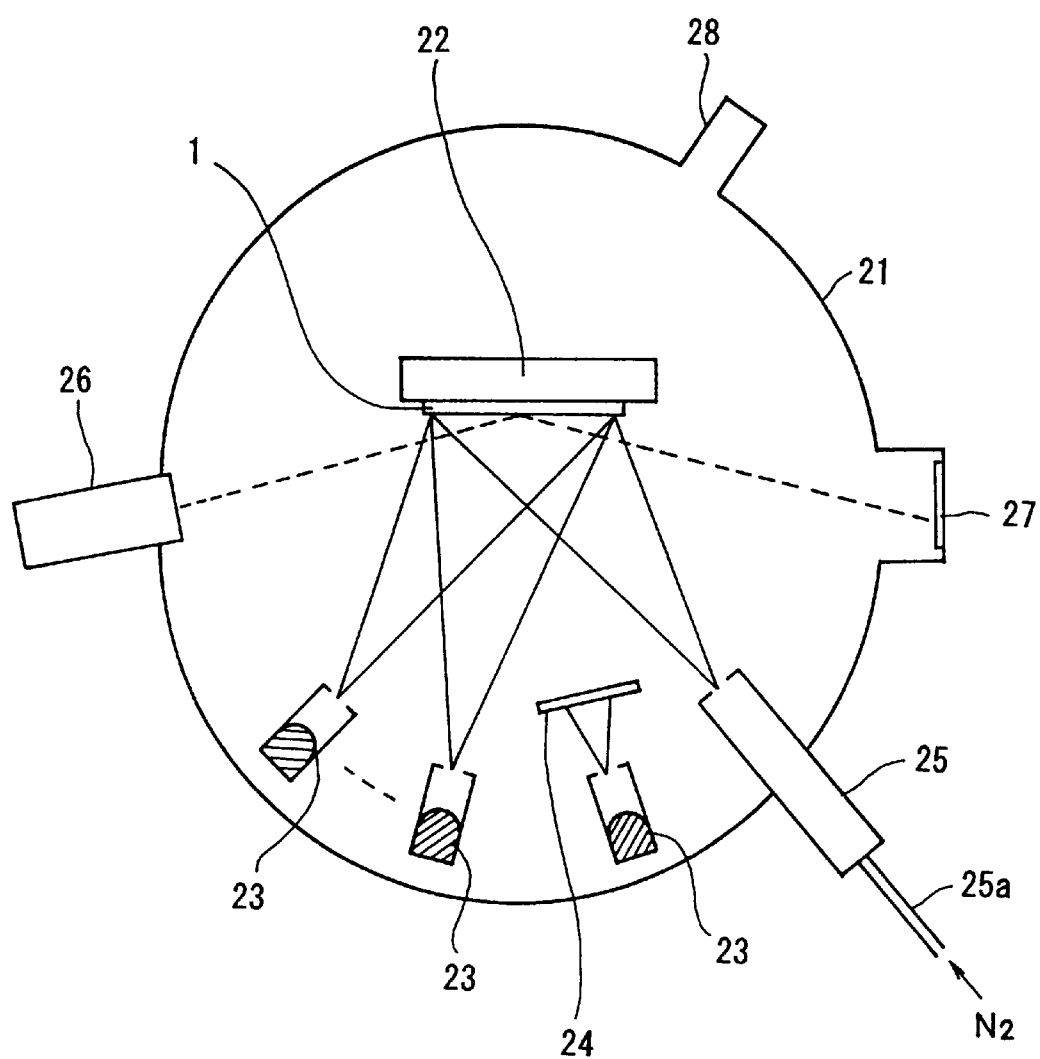
FIG. 11 is a schematic diagram showing a MBE apparatus used for growing II–VI compound semiconductor layers in the first embodiment of the invention.

After that, the n-type GaAs substrate 1 having grown the n-type GaAs buffer layer 2 is transferred from the MBE apparatus for growth of III–V compound semiconductors through a vacuum transport line (not shown) to another MBE apparatus for growth of II–VI compound semiconductors shown in FIG. 11. In the MBE apparatus shown in FIG. 11, II–VI compound semiconductor layers forming the laser structure are grown. In this case, the surface of the n-type GaAs buffer layer 2 is not exposed to ambient air during transport to the MBE apparatus shown in FIG. 11 after it is grown, and therefore kept clean.

As shown in FIG. 11, in the MBE apparatus, a substrate holder 22 is provided in a vacuum chamber evacuated into an ultra-high vacuum by an ultrahigh evacuating apparatus (not shown), and the substrate for growing layers thereon is put on the substrate holder 22. In the vacuum chamber 21, a plurality of molecular beam sources (Knudsen cells) are provided in confrontation with the substrate holder 22. In this case, molecular beam sources 23 of Zn, Se, Mg, ZnS, Cd, Te, $ZnCl_2$, and so on, are prepared. Shutters 24 movable between opening and closing positions are provided in front of individual molecular beam sources 23. The vacuum chamber 21 further contains a plasma cell 25 using electron cyclotron resonance or high frequency (RF) is provided in confrontation with the substrate holder 22. Further provided in the vacuum chamber 21 are a reflection high energy electron diffraction (RHEED) electron gun 26 and a fluorescent screen 27 to permit an engineer to externally observe the RHEED image on the substrate surface. The vacuum chamber 21 further contains a quadrupole mass spectrometer 28.

For growing II–VI compound semiconductor layers forming the laser structure on the n-type GaAs buffer layer 2, the n-type GaAs substrate 1 having grown the n-type GaAs buffer layer 2 is set on the substrate holder 22 in the vacuum chamber 21 of the MBE apparatus shown in FIG. 11. Then, the n-type GaAs substrate 1 is fixed to a predetermined growth temperature, approximately, 300° C. for example, and growth by MBE is started. That is, sequentially grown on the n-type GaAs buffer layer 2 are the n-type ZnSe buffer layer 3, n-type ZnSSe buffer layer 4, n-type ZnMgSSe cladding layer 5, n-type ZnSSe optical guide layer 6a, active layer 7, n-type ZnSSe optical guide layer 6b, undoped ZnSSe optical guide layer 8, p-type ZnMgSSe cladding layer 9, p-type ZnSSe cap layer 10, p-type ZnSe contact layer 11, p-type ZnSe/ZnTe MQW layer 12 and p-type ZnTe contact layer 13.

For doping Cl as the n-type impurity into the n-type ZnSe buffer layer 3, n-type ZnSSe buffer layer 4, n-type ZnMgSSe cladding layer 5, n-type ZnSSe optical guide layer 6a, active layer 7 and n-type ZnSSe optical guide layer 6b, $ZnCl_2$, for example, is used as the dopant. For doping N as the p-type impurity into the p-type ZnMgSSe cladding layer 9, p-type ZnSSe cap layer 10, p-type ZnSe contact layer 11, p-type ZnSe/ZnTe MQW layer 12 and p-type ZnTe contact layer 13, $N_2$ gas introduced from a nitrogen gas inlet pipe 25a is processed into plasma, and $N_2$ plasma produced thereby is irradiated onto the substrate surface.

After that, a stripe-shaped resist pattern (not shown) extending in one direction is formed on the p-type ZnTe contact layer 13 by lithography. Using the resist pattern as a mask, wet etching, for example, is conducted for selective removal to the depth of an intermediate thickness of the p-type ZnSSe cap layer 10. As a result, an upper-lying portion of the p-type ZnSSe cap layer 10, p-type ZnSe contact layer 11, p-type ZnSe/ZnTe MQW layer 12 and p-type ZnTe contact layer 13 are patterned into a stripe extending in the <110> orientation.

While maintaining the resist pattern used for the etching, an $Al_2O_3$ film is formed on the entire surface by vacuum evaporation, for example. The resist pattern is thereafter removed together with the $Al_2O_3$ film thereon (lift-off). As a result, the insulation layer 14 is formed at opposite sides of the upper-lying portion of the p-type ZnSSe cap layer 10, p-type ZnSe contact layer 11, p-type ZnSe/ZnTe MQW layer 12 and p-type ZnTe contact layer 13.

After that, a Pd film, Pt film and Au film are sequentially stacked by vacuum evaporation to make the Pd/Pt/Au p-side electrode 15 on the entire surface of the stripe-shaped p-type ZnTe contact layer 13 and the insulation film 14 at opposite sides thereof. Thereafter, with or without annealing, the p-side electrode 15 is brought into ohmic contact with the p-type ZnTe contact layer 13. On the other hand, the n-side electrode 16, such as In electrode, is formed on the bottom surface of the n-type GaAs substrate 1.

The n-type GaAs substrate 1 having formed the laser structure thereon is next cleaved to make opposite cavity edges, and the bar is cleaved into chips after coating the edges, if necessary. The laser chip obtained in this manner is mounted on a heat sink and packaged to complete the intended semiconductor laser.

Figure 12:
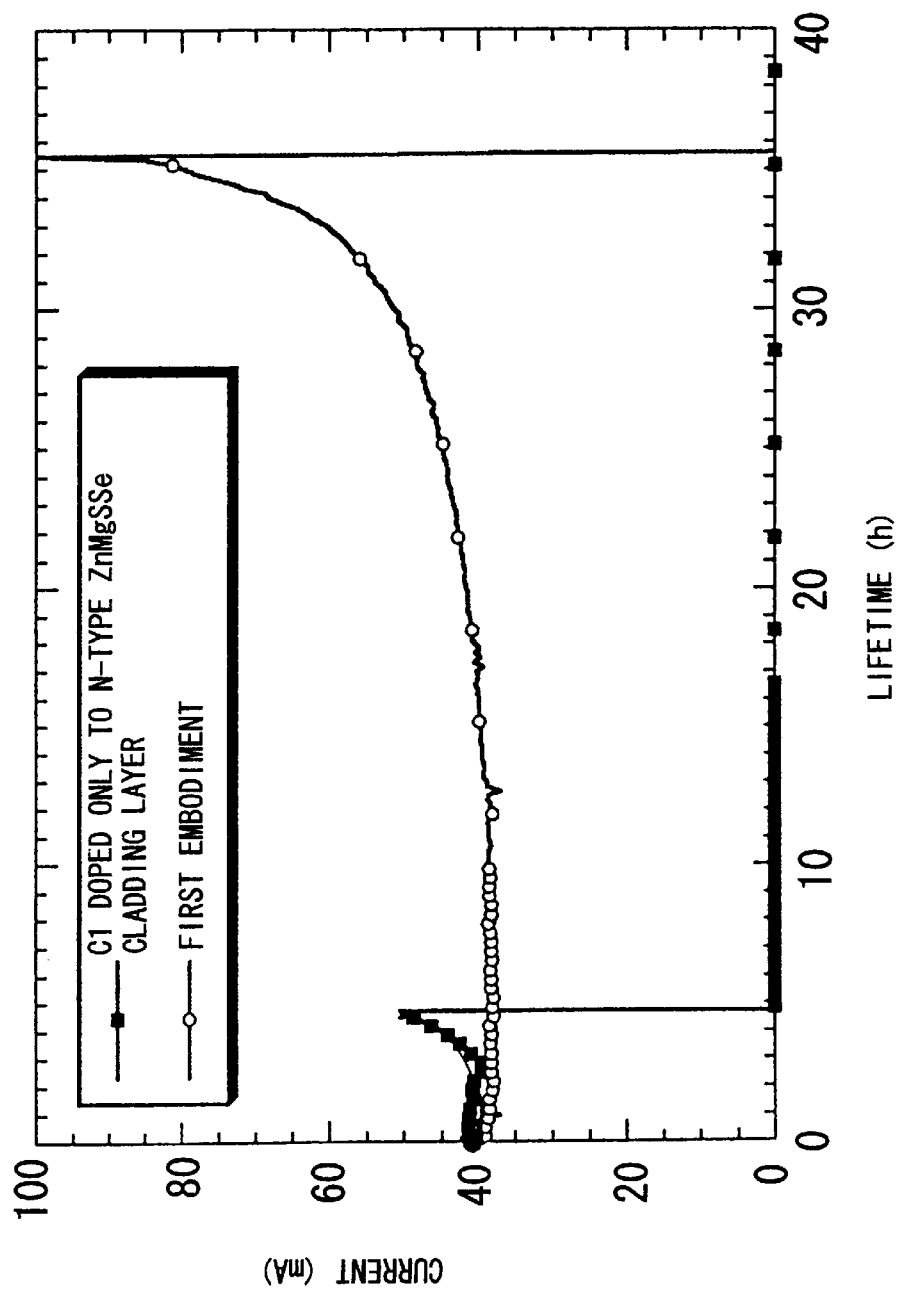
FIG. 12 is a schematic diagram showing a result of measurement of lifetime of the semiconductor laser according to the first embodiment of the invention.

FIG. 12 shows measured lifetimes of devices some of which are prepared according to the invention and the other of which are prepared by doping Cl only into the n-type ZnMgSSe cladding layer 5. It is apparent from FIG. 12 that semiconductor lasers according to the first embodiment prepared by doping Cl to the depth up to approximately one third the thickness of the p-type ZnSSe optical guide layer in conventional semiconductor lasers have much longer lifetimes than conventional semiconductor lasers in which Cl is doped only into the n-type ZnMgSSe cladding layer.

As explained above, according to the first embodiment, since the active layer 7 is provided inside the n-type doped layer distant from the depletion layer by $L \geq L_{n0}$, namely, since it is located between the n-type ZnSSe optical guide layer 6a and the n-type ZnSSe optical guide layer 6b, the active layer 7 is prevented from getting depleted. As a result, no electric field is applied to the active layer 7 in an equilibrium balanced state, and the conduction type inside the active layer 7 can be maintained in the n-type. Since the group II vacancy, which is one of point defects, behaves as an acceptor, by maintaining the n-type conductivity of the active layer 7, free electrons are readily captured, and the electronic state is stabilized. It contributes to suppressing movement of the group II vacancies and suppressing diffusion of Cd therethrough. Therefore, when the substrate temperature is high during growth of p-type doped layers after growth of the active layer 7 or the temperature of the active layer 7 increases due to non-radiative recombination while the semiconductor laser is electrically powered, although movements of point defects are promoted by absorption of heat energy, but the mobility of the group II vacancy can be decreased by maintaining the n-type conductivity of the active layer 7, and as a result, diffusion of Cd atoms can be prevented.

Because of the mechanism explained above, deterioration of the active layer 7 is prevented, good carrier injection efficiency is ensured, and a semiconductor laser having good characteristics, low threshold current value, high reliability and long lifetime can be realized.

Next explained is a semiconductor laser according to the second embodiment of the invention.

In the semiconductor laser according to the first embodiment, if the total thickness of the n-type ZnSSe optical guide layer 6b and the undoped ZnSSe optical guide layer 8 is $l_g$, the thickness of the n-type ZnSSe optical guide layer 6b is L, and the thickness of the undoped ZnSSe optical guide layer 8 is l, then $l_g=L+l$. When substituting $l=l_g-x$, Equation (13) becomes $$(N_d/N_a-1)x^2+2l_g x=(2\epsilon_0\epsilon/eN_d)V_{Bi}$$

Assuming that $N_a=N_d$, the equation can be solved for x as:

$$x=(\epsilon_0\epsilon/eN_d l_g)V_{Bi}$$

If, $V_{Bi}=2.6$ eV, $N_a=1\times10^{17} cm^{-3}$, $N_d=1\times10^{17} cm^{-3}$, l=100 nm, $\epsilon=9.3$, then x=13.4 nm.

Thus, the second embodiment determines as L≧13.4 nm. In the other respects, the second embodiment is the same as the first embodiment.

Also the second embodiment attains the same advantages as those of the first embodiment.

Figure 13:
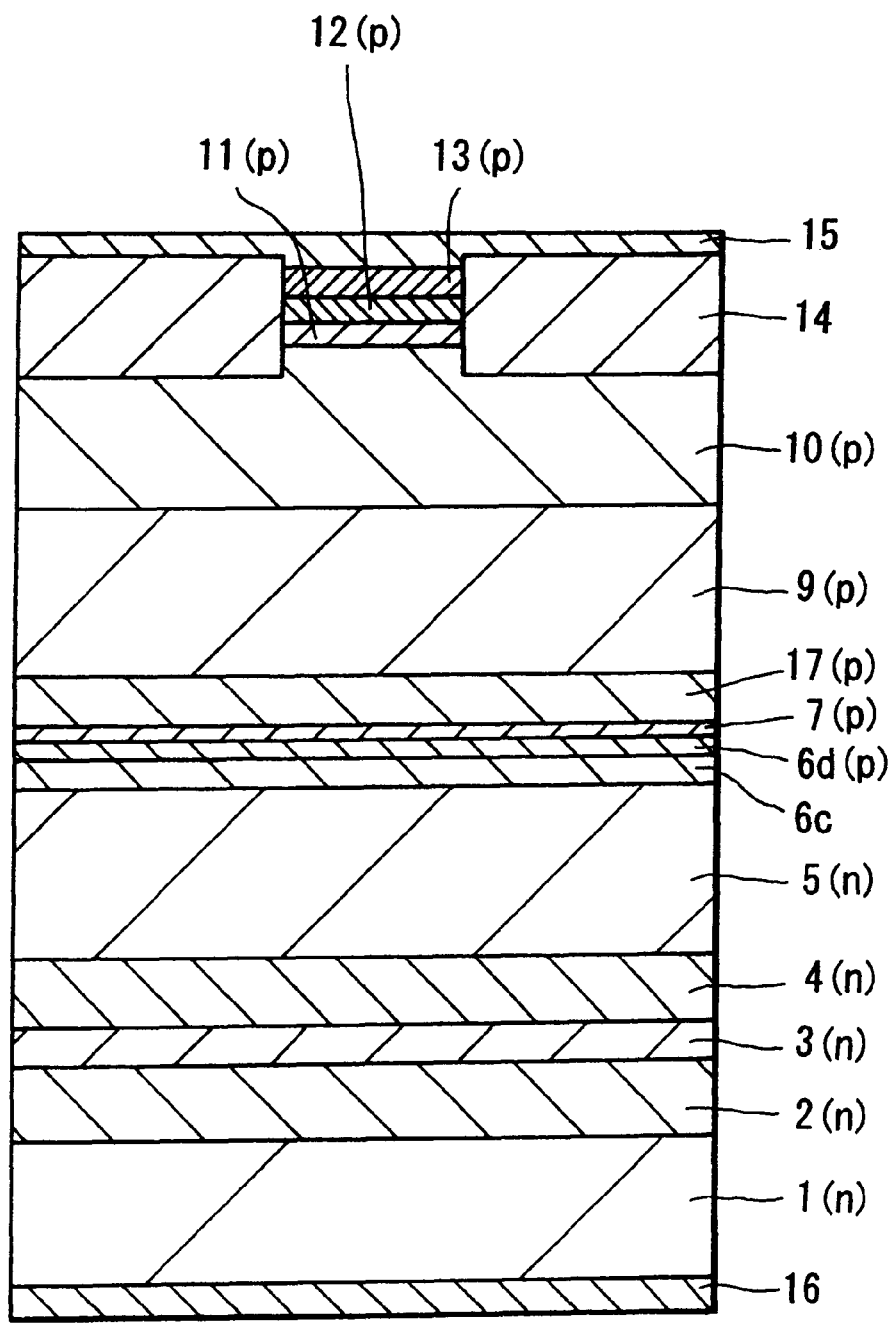
FIG. 13 is a cross-sectional view of a semiconductor laser according to the third embodiment of the invention.
Figure 14:
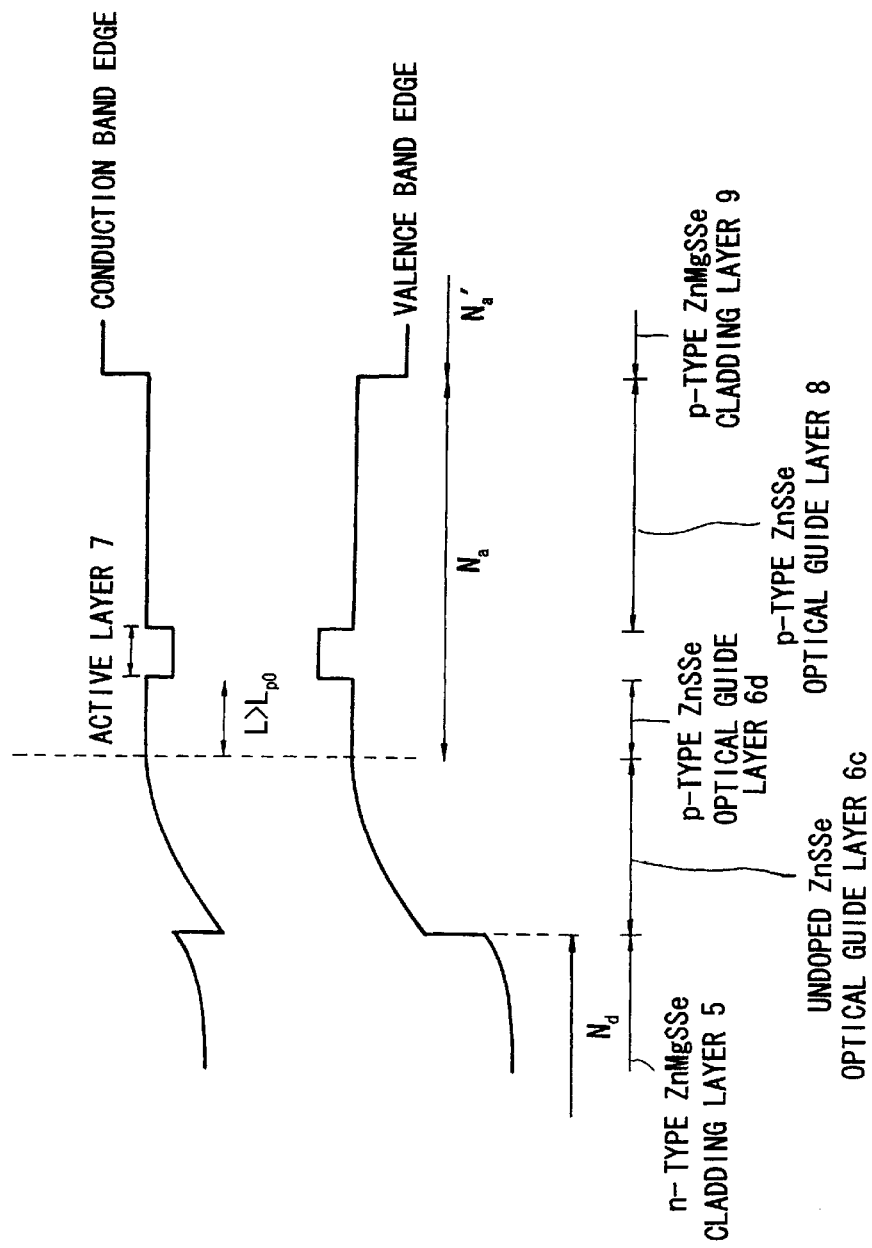
FIG. 14 is an energy band diagram of the semiconductor laser according to the third embodiment of the invention.

FIG. 13 shows a semiconductor laser according to the third embodiment of the invention. FIG. 14 shows an energy band diagram around the active layer in the semiconductor laser according to the third embodiment.

As shown in FIG. 13, in the semiconductor laser according to the third embodiment, an undoped ZnSSe optical guide layer 6c, p-type ZnSSe optical guide layer 6d, p-type active layer 7 and p-type ZnSSe optical guide layer 17 are stacked sequentially on an n-type ZnMgSSe cladding layer 5. In other words, the active layer 7 is sandwiched between the p-type ZnSSe optical guide layer 6d and the p-type ZnSSe optical guide layer 17, and located inside the p-type doped layer. Additionally, as shown in FIG. 11, the active layer 7 is distant from the boundary between the p-type ZnSSe optical guide layer 6d and the undoped ZnSSe optical guide layer 6c by a distance $L \geq L_{p0}$. In the other respects, the semiconductor laser shown here is the same as the semiconductor laser according to the first embodiment.

According to the third embodiment, since the active layer is located inside the p-type doped layer distant from the depletion layer by $L \geq L_{p0}$, namely between the p-type ZnSSe optical guide layer 6d and the p-type ZnSSe optical guide layer 17, the active layer 7 is prevented from getting depleted, and the Fermi level near the active layer 7 can be always maintained immediately above the valence band. Therefore, the active layer 7 can be kept in p-type conductivity, electronic state of point defects behaving as donors can be stabilized, and their aggregation and multiplication can be prevented. This is especially effective when most of the point defects of the active layer 7 are group VI vacancy.

Because of the mechanism explained above, deterioration of the active layer 7 is prevented, good carrier injection efficiency is ensured, and a semiconductor laser having good characteristics, low threshold current value, high reliability and long lifetime can be realized.

Figure 15:
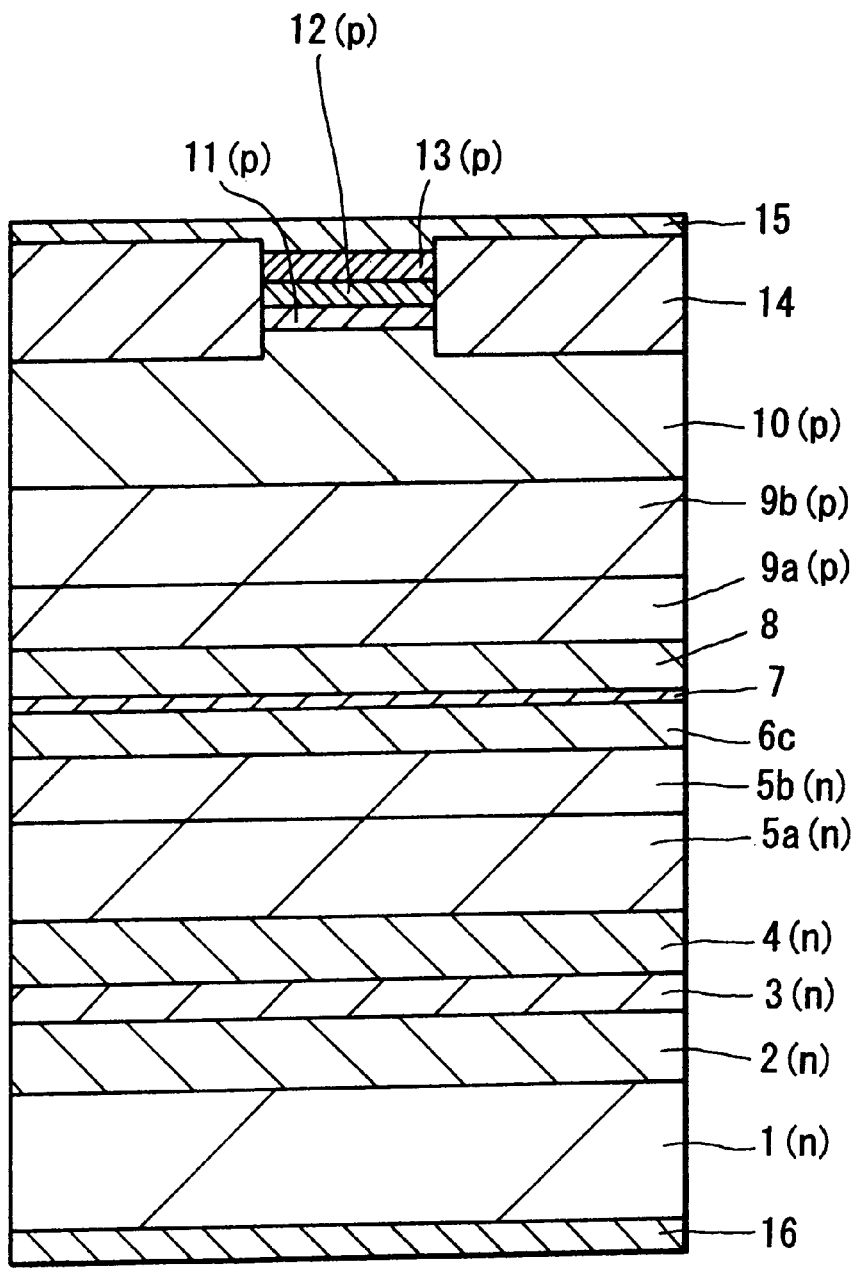
FIG. 15 is a cross-sectional view of a semiconductor laser according to the fourth embodiment of the invention.

FIG. 15 shows a semiconductor laser according to the fourth embodiment of the invention. As shown in FIG. 15, in the semiconductor laser according to the fourth embodiment, sequentially stacked on an n-type ZnSSe buffer layer 4 are an n-type ZnMgSSe cladding layer 5a, n-type ZnMgSSe cladding layer 5b, undoped ZnSSe optical guide layer 6c, undoped active layer 7, undoped ZnSSe optical guide layer 8, p-type ZnMgSSe cladding layer 9a and p-type ZnMgSSe cladding layer 9b. Doping concentration of the n-type ZnMgSSe cladding layer 5a is $3 \times 10^{17} cm^{-3}$, doping concentration of the n-type ZnMgSSe cladding layer 5b is $8 \times 10^{16} cm^{-3}$ which is approximately one third the concentration of the n-type ZnMgSSe cladding layer 5a, and doping concentration of the p-type ZnMgSSe cladding layer 9a is $3 \times 10^{17} cm^{-3}$. The n-type ZnMgSSe cladding layer 5b with the low doping concentration is thicker than the penetration length $L_n$, namely, 300 nm. In the other respects, the embodiment shown here is the same as the first embodiment.

According to the fourth embodiment, since the doping concentration of the n-type ZnMgSSe cladding layer 5b located within the range of the penetration length $L_n$ from the active layer 7 is lower than the doping concentration of the n-type ZnMgSSe cladding layer 5a located remoter from the active layer 7, Cl atoms excited and diffused by light exuding into the n-type ZnMgSSe cladding layer 5b can be minimized. As a result, deterioration of the active layer 7 can be prevented, and a semiconductor laser not increasing the threshold current value and having good characteristics, low threshold current value, high reliability and long lifetime can be realized.

Figure 16:
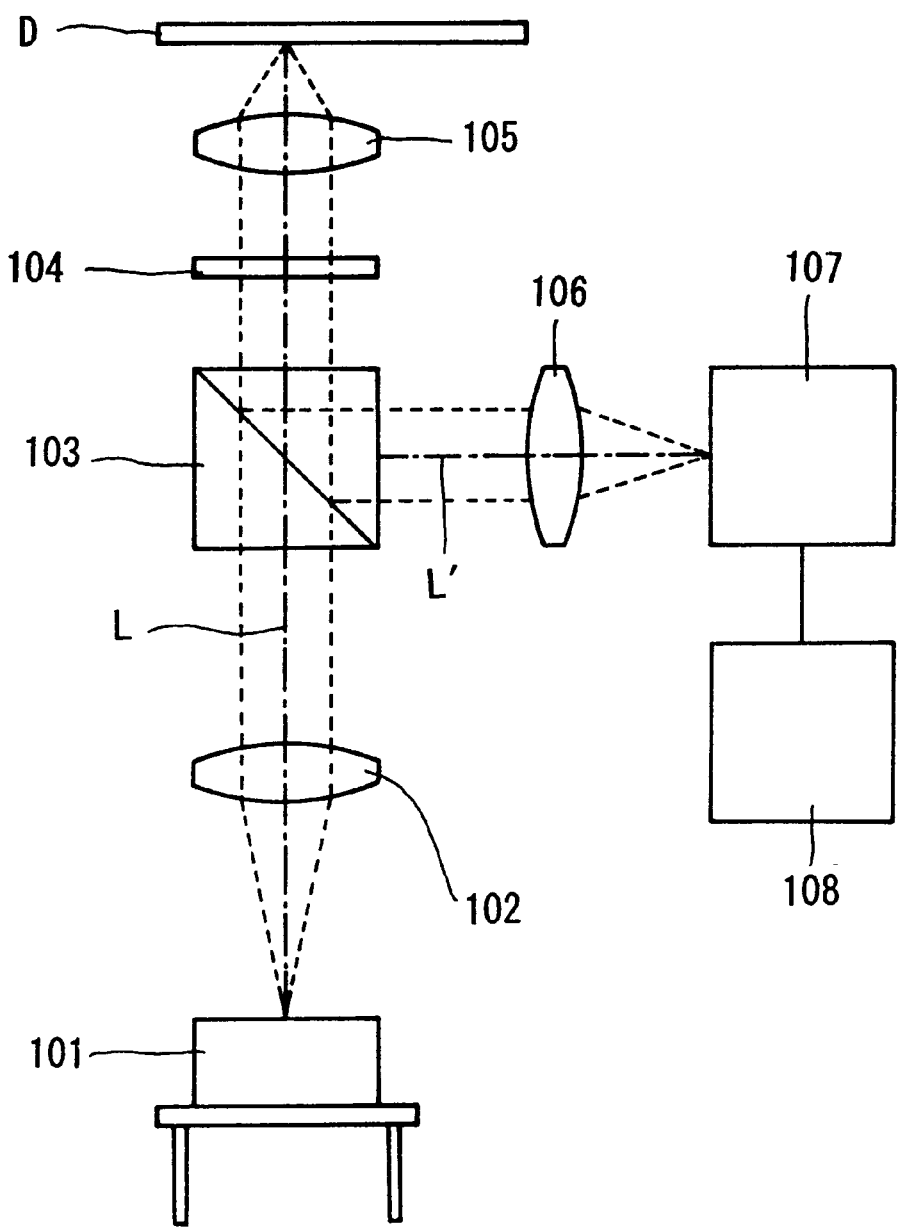
FIG. 16 is a schematic diagram showing an optical disc reproducing apparatus using the semiconductor laser according to the first, second, third or fourth embodiment of the invention as its light emitting device.

Next explained is an optical disc reproducing apparatus using as its light emitting device a semiconductor laser according to the first, second, third or fourth embodiment for emission of blue to green light. FIG. 16 shows construction of the optical disc reproducing apparatus.

As shown in FIG. 16, the optical disc reproducing apparatus includes a semiconductor laser 101 as its light emitting device. The semiconductor laser 101 may be one according to the first or second embodiment explained above. The optical disc reproducing apparatus further includes a known optical system for guiding light released from the semiconductor laser 101 onto an optical disc D and for reproducing the reflected light (signal light) from the optical disc D, that is, collimator lens 102, beam splitter 103, ¼ wavelength plate 104, objective lens 105, detector lens 106, signal light detecting photo receiver element 107 and signal light reproducing circuit 108.

In the optical disc reproducing apparatus, light L released from the semiconductor laser 101 is collimated by the collimator lens 102, made to pass through the beam splitter 103, adjusted in polarization by the ¼ wavelength plate 104, and focused onto the optical disc D by the objective lens 105. Signal light L' reflected from the optical disc D and passing through the object lens 105 and the ¼ wavelength plate 104 is reflected by the beam splitter 103, then introduced through the detector lens 106 into the signal light detecting photo receiver element 107, and converted there into an electric signal, and information written on the optical disc D is reproduced in the signal light reproducing circuit 108.

Since the semiconductor laser 101 used in the optical disc reproducing apparatus is a semiconductor laser according to the first, second, third or fourth embodiment having a long lifetime, the lifetime of the optical disc reproducing apparatus can be elongated.

Although an example is shown above as using a semiconductor laser according to the first, second, third or fourth embodiment as a light emitting device of an optical disc reproducing apparatus, it would be needless to say that the semiconductor laser can be used as a light emitting device in any of other various optical devices such as optical disc record/reproducing apparatus or optical communication apparatus, and it can be used also as a light emitting device of a carborne equipment required to be operative under a high temperature, an image display, or the like.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first, second, third and fourth embodiments have been explained as applying the invention to semiconductor lasers having a SCH structure, the invention is applicable also to semiconductor lasers having a DH structure (Double Heterostructure). In addition, although the first and second embodiments have been explained as applying the invention to semiconductor lasers, the invention is applicable to light emitting diodes as well.

As described above, the present invention can provide a semiconductor light emitting device having good characteristics, high reliability and long lifetime.

What is claimed is:

1. A semiconductor light emitting device having a p-n junction made of a p-type doped layer and an n-type doped layer, or a p-i-n junction made of a p-type doped layer, an undoped layer and an n-type doped layer, comprising:

an active layer located in a position inside said n-type doped layer distant from the boundary between said p-type doped layer or said undoped layer and said n-type doped layer by a distance L satisfying L≧L0 relative to a positive value L0 obtained by solving x from the equation $$(eN_d/2\epsilon_0\epsilon)\{(N_d/N_a+1)x^2+2lx\}-V_{Bi}=0$$

where $N_a$ is the doping concentration of said p-type doped layer, $N_d$ is the doping concentration of said n-type doped layer, l is the thickness of said undoped layer (regarded as l=0 in case of said p-n junction), $V_{Bi}$ is the built-in potential produced between said p-type doped layer and said n-type doped layer, $\epsilon$ is the specific dielectric constant of said p-type doped layer, said n-type doped layer and said undoped layer, $\epsilon_0$ is the dielectric constant of vacuum, and e is the electric charge of an electron.

2. The semiconductor light emitting device according to claim 1 wherein L≦150 nm.

3. The semiconductor light emitting device according to claim 1 wherein doping concentration of said n-type doped layer is not lower than $3\times10^{16}$cm$^{-3}$ and not higher than $3\times10^{17}$cm$^{-3}$.

4. The semiconductor light emitting device according to claim 1 wherein said p-type doped layer, said n-type doped layer, said undoped layer and said active layer are made of II–VI compound semiconductors including at least one of group II elements selected from the group consisting of Zn, Cd, Mg, Hg and Be and at least one of group VI elements selected from the group consisting of S, Se, Te and O.

5. The semiconductor light emitting device according to claim 1 wherein the n-type impurity doped into said n-type doped layer is Cl.

6. The semiconductor light emitting device according to claim 5 wherein the p-type impurity doped into said p-type doped layer is N.

7. A semiconductor light emitting device having a p-n junction made of a p-type doped layer and an n-type doped layer, or a p-i-n junction made of a p-type doped layer, an undoped layer and an n-type doped layer, comprising:

an active layer located in a position inside said p-type doped layer distant from the boundary between said p-type doped layer or said undoped layer and said n-type doped layer by a distance L satisfying L≧L0 relative to a positive value L0 obtained by solving x from the equation $$(eN_a/2\epsilon_0\epsilon)\{(N_a/N_d+1)x^2+2lx\}-V_{Bi}=0$$

where $N_a$ is the doping concentration of said p-type doped layer, $N_d$ is the doping concentration of said n-type doped layer, l is the thickness of said undoped layer (regarded as l=0 in case of said p-n junction), $V_{Bi}$ is the built-in potential produced between said p-type doped layer and said n-type doped layer, $\epsilon$ is the specific dielectric constant of said p-type doped layer, said n-type doped layer and said undoped layer, $\epsilon_0$ is the dielectric constant of vacuum, and e is the electric charge of an electron.

8. The semiconductor light emitting device according to claim 7 wherein L≦150 nm.

9. The semiconductor light emitting device according to claim 7 wherein doping concentration of said p-type doped layer is not lower than $3\times10^{16}$cm$^{-3}$ and not higher than $3\times10^{17}$cm$^{-3}$.

10. The semiconductor light emitting device according to claim 7 wherein said p-type doped layer, said n-type doped layer, said undoped layer and said active layer are made of II–VI compound semiconductors including at least one of group II elements selected from the group consisting of Zn, Cd, Mg, Hg and Be and at least one of group VI elements selected from the group consisting of S, Se, Te and O.

11. A semiconductor light emitting device having a p-n junction made of a p-type doped layer and an n-type doped layer, characterized in that:

a doping concentration $N_{ds}$ of at least a part of said n-type doped layer where x>$-L_n$ is lower than doping concentration $N_d$ of the other part of said n-type doped layer, when the component of the intensity of light emitted from an active layer along a coordinate axis x extending from said n-type doped layer toward said p-type doped layer, x for the maximum value $P_{max}$ of P(x) is x=0, and x for P(x)>$P_{max}/e^2$ (where e is the base of natural logarithm) is in the range of $-L_n$<x<$L_p$ wherein:

P(x) is an x-direction component of the intensity of light emitted from the active layer, $L_n$ is a penetration length of light released from the active layer into the n-type doped layer, and $L_p$ is a penetration length of light released from the active layer into the p-type doped layer.

12. The semiconductor light emitting device according to claim 11 wherein doping concentration $N_{as}$ of at least a part of said p-type doped layer where x<$L_p$ is lower than doping concentration $N_a$ of the other part of said p-type doped layer.

13. The semiconductor light emitting device according to claim 12 wherein, when the thickness of a layer in said p-type doped layer having a doping concentration $N_{ds}$ is $L_{ns}$, and the thickness of a layer in said p-type doped layer having a doping concentration $N_{as}$ is $L_{ps}$, at least one of $L_{ps}$ and $L_{ns}$ is not larger than 500 nm.

14. The semiconductor light emitting device according to claim 11 wherein doping concentration $N_{ds}$ of said n-type doped layer is not lower than $3\times10^{16}$cm$^{-3}$ and not higher than $3\times10^{17}$cm$^{-3}$.

15. The semiconductor light emitting device according to claim 11 wherein, when the thickness of a layer in said n-type doped layer having a doping concentration $N_{ds}$ is $L_{ns}$, $L_{ns}$ is not larger than 500 nm.

16. The semiconductor light emitting device according to claim 11 wherein said p-type doped layer, said n-type doped layer and said active layer are made of II–VI compound semiconductors including at least one of group II elements selected from the group consisting of Zn, Cd, Mg, Hg and Be and at least one of group VI elements selected from the group consisting of S, Se, Te and O.

17. The semiconductor light emitting device according to claim 16 wherein said p-type doped layer, said n-type doped layer and said active layer are made of II–VI compound semiconductors including at least one of group II elements selected from the group consisting of Zn, Cd, Mg, Hg and Be and at least one of group VI elements selected from the group consisting of S, Se, Te and O.

18. The semiconductor light emitting device according to claim 11 wherein the n-type impurity doped into said n-type doped layer is Cl.

19. A semiconductor light emitting device having a p-n junction made of a p-type doped layer and an n-type doped layer, characterized in that:

a doping concentration $N_{as}$ of at least a part of said p-type doped layer where $x<L_p$ is lower than doping concentration $N_a$ of the other part of said p-type doped layer, when the component of the intensity of light emitted from an active layer along a coordinate axis x extending from said n-type doped layer toward said p-type doped layer, x for the maximum value $P_{max}$ of P(x) is x=0, and x for $P(x)>P_{max}/e^2$ (where e is the base of natural logarithm) is in the range of $-L_n<x<L_p$ wherein:

P(x) is an x-direction component of the intensity of light emitted from the active layer, $L_n$ is a penetration length of light released from the active layer into the n-type doped layer, and $L_p$ is a penetration length of light released from the active layer into the p-type doped layer.

20. The semiconductor light emitting device according to claim 19 wherein doping concentration $N_{ds}$ of at least a part of said n-type doped layer where $x>-L_n$ is lower than doping concentration $N_d$ of the other part of said n-type doped layer.

21. The semiconductor light emitting device according to claim 20 wherein, when the thickness of a layer in said n-type doped layer having a doping concentration $N_{ds}$ is $L_{ns}$, and the thickness of a layer in said p-type doped layer having a doping concentration $N_{as}$ is $L_{ps}$, at least one of $L_{ps}$ and $L_{ns}$ is not larger than 500 nm.

22. The semiconductor light emitting device according to claim 19 wherein doping concentration $N_{as}$ of said p-type doped layer is not lower than $3\times10^{16} cm^{-3}$ and not higher than $3\times10^{17} cm^{-3}$.

23. The semiconductor light emitting device according to claim 19 wherein the p-type impurity doped into said p-type doped layer is N.

\* \* \* \* \*